US012581931B2

(12) United States Patent

Kim et al.

(10) Patent No.: US 12,581,931 B2

(45) Date of Patent: Mar. 17, 2026

(54) SEMICONDUCTOR PACKAGE AND METHOD OF MANUFACTURING THE SAME

(71) Applicant: Samsung Electronics Co., Ltd., Suwon-si (KR)

(72) Inventors: Juhyeon Kim, Suwon-si (KR); Ilhwan Kim, Suwon-si (KR); Sunkyoung Seo, Suwon-si (KR); Chajea Jo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 534 days.

(21) Appl. No.: 18/296,056

(22) Filed: Apr. 5, 2023

(65) Prior Publication Data

US 2024/0006272 A1      Jan. 4, 2024

(30) Foreign Application Priority Data

Jul. 4, 2022    (KR) ........................ 10-2022-0081724

(51) Int. Cl.
*H01L 23/31*          (2006.01)
*H10W 20/20*          (2026.01)
          (Continued)

(52) U.S. Cl.
CPC ........... *H10W 20/20* (2026.01); *H10W 20/48* (2026.01); *H10W 70/65* (2026.01);
          (Continued)

(58) Field of Classification Search
CPC . H01L 23/481; H01L 21/565; H01L 23/3128; H01L 23/49822; H01L 23/49838; H01L 23/5329; H01L 24/05; H01L 24/16; H01L 24/32; H01L 24/73; H01L 25/0657; H01L 2224/0557; H01L 2224/16235; H01L 2224/32225; H01L 2224/73203; H01L 2225/06513; H01L 2221/68327;

(Continued)

(56) References Cited

U.S. PATENT DOCUMENTS

| 10,290,611 B2 | 5/2019 | Yu et al. |
| 10,784,247 B2 | 9/2020 | Chen et al. |

(Continued)

*Primary Examiner* — Elias Ullah

(74) *Attorney, Agent, or Firm* — Wolf, Greenfield & Sacks, P.C.

(57) ABSTRACT

A semiconductor package includes: a first semiconductor chip including first pads; a second semiconductor chip below the first semiconductor chip, the second semiconductor chip including a substrate including a front surface and an opposing rear surface, second pads on the front surface and in contact with the first pads, and through-electrodes electrically connected to the second pads and including protruding portions protruding from the rear surface of the substrate; through-via structures disposed around the second semiconductor chip and in contact with the first pads; a first dielectric layer extending along the rear surface of the substrate and side surfaces of the protruding portions of the through-electrodes; a second dielectric layer below the first dielectric layer and in a space between the protruding portions of the through-electrodes and between the through-via structures; and bump structures below the second dielectric layer and electrically connected to the through-electrodes and the through-via structures.

20 Claims, 9 Drawing Sheets

(51) Int. Cl.

| | |
|---|---|
| *H10W 20/48* | (2026.01) |
| *H10W 70/65* | (2026.01) |
| *H10W 70/685* | (2026.01) |
| *H10W 74/01* | (2026.01) |
| *H10W 74/10* | (2026.01) |
| *H10W 90/00* | (2026.01) |
| *H10W 72/00* | (2026.01) |
| *H10W 72/90* | (2026.01) |

(52) U.S. Cl.
CPC ....... *H10W 70/685* (2026.01); *H10W 74/016* (2026.01); *H10W 74/117* (2026.01); *H10W 90/00* (2026.01); *H10W 72/856* (2026.01); *H10W 72/942* (2026.01); *H10W 90/722* (2026.01); *H10W 90/724* (2026.01); *H10W 90/734* (2026.01)

(58) Field of Classification Search
CPC . H01L 2221/68345; H01L 2221/68359; H01L 21/568; H01L 21/6835; H01L 23/291; H01L 23/3171; H01L 23/3185; H01L 23/3135; H01L 23/3675; H01L 23/49816; H01L 23/5383; H01L 24/80; H01L 2224/80048; H01L 2224/80203; H01L 21/76898; H01L 2224/80894; H01L 2225/06527; H01L 2225/06541; H01L 2225/06548; H01L 23/5386; H01L 23/5384; H01L 23/5389; H01L 24/13; H01L 2224/13016; H01L 2224/13018; H01L 2224/13024; H01L 2224/13025; H01L 23/293; H01L 23/3192; H01L 24/07; H01L 25/18; H01L 25/50; H01L 2224/08123; H01L 2224/08145; H01L 2224/085; H01L 2225/06524; H01L 2225/06586

See application file for complete search history.

(56) References Cited

U.S. PATENT DOCUMENTS

| | | | |
|---|---|---|---|
| 10,867,879 | B2 | 12/2020 | Yu et al. |
| 11,145,623 | B2 | 10/2021 | Hsu et al. |
| 11,233,035 | B2 | 1/2022 | Chen et al. |
| 2020/0118915 | A1 | 4/2020 | Yu et al. |
| 2021/0098380 | A1 | 4/2021 | Chen et al. |

10B

10C

10D

10E

SEMICONDUCTOR PACKAGE AND METHOD OF MANUFACTURING THE SAME

CROSS-REFERENCE TO RELATED APPLICATION

This application claims the priority and benefit of Korean Patent Application No. 10-2022-0081724, filed on Jul. 4, 2022, with the Korean Intellectual Property Office, the disclosure of which is incorporated herein by reference in its entirety.

FIELD

The present inventive concept relates to a semiconductor package and a method of manufacturing the same.

BACKGROUND

Semiconductor devices mounted on electronic devices are required to be miniaturized, as well as to have high performance and high capacitance. To implement this, a semiconductor package for interconnecting semiconductor chips stacked in a vertical direction using a through-electrode (e.g., through-silicon via) is being developed.

SUMMARY

An aspect of the present inventive concept is to provide a semiconductor package in which a process is simplified and a yield is improved, and a method for manufacturing the same.

According to an aspect of the present inventive concept, a semiconductor package includes: a first semiconductor chip including first pads; a second semiconductor chip below the first semiconductor chip, the second semiconductor chip including a substrate including a front surface and a rear surface opposing each other, second pads on the front surface and in contact with the first pads, and through-electrodes electrically connected to the second pads and including protruding portions protruding from the rear surface of the substrate; through-via structures disposed around the second semiconductor chip and in contact with the first pads; a first dielectric layer extending along the rear surface of the substrate and side surfaces of the protruding portions of the through-electrodes; a second dielectric layer below the first dielectric layer and in (e.g., filling) a space between the protruding portions of the through-electrodes and between the through-via structures; and bump structures below the second dielectric layer and electrically connected to the through-electrodes and the through-via structures.

According to an aspect of the present inventive concept, a semiconductor package includes: a first semiconductor chip including first pads; a second semiconductor chip including a substrate including a front surface and a rear surface opposing each other, second pads on the front surface and in contact with the first pads, and a through-electrode electrically connected to the second pads and including a protruding portion protruding from the rear surface through the substrate; a first dielectric layer including a first portion surrounding a side surface of the protruding portion of the through-electrode and a second portion extending from one end of the first portion along the rear surface of the substrate; and a second dielectric layer below or covering the first portion and the second portion of the first dielectric layer.

According to an aspect of the present inventive concept, a semiconductor package includes: a first semiconductor chip including first pads; a second semiconductor chip below the first semiconductor chip, the second semiconductor chip including a substrate including a front surface and a rear surface opposing each other, second pads on the front surface and electrically connected to the first pads, and through-electrodes electrically connected to the second pads and including protruding portions protruding from the rear surface of the substrate; a first dielectric layer on or covering a lower surface of the first semiconductor chip, a side surface and a lower surface of the second semiconductor chip, and side surfaces of the protruding portions of the through-electrodes; a second dielectric layer below or covering at least a portion of each of the first semiconductor chip and the second semiconductor chip and below the first dielectric layer, the second dielectric layer including a material different from a material of the first dielectric layer; and bump structures disposed below the second dielectric layer and electrically connected to the through-electrodes.

According to an aspect of the present inventive concept, a method of manufacturing a semiconductor package includes: preparing a semiconductor wafer including first pads; attaching a second semiconductor chip including a preliminary substrate, second pads on a front surface of the preliminary substrate, and a plurality of preliminary through-electrodes embedded in the preliminary substrate to the semiconductor wafer; etching the preliminary substrate to expose at least a portion of each of the plurality of preliminary through-electrodes; forming a first preliminary dielectric layer on or covering the semiconductor wafer, the second semiconductor chip, and the plurality of exposed preliminary through-electrodes, the first preliminary dielectric layer including a first opening exposing at least a portion of the first pads; forming a preliminary seed layer on the first preliminary dielectric layer; forming a resist layer having a second opening aligned with or corresponding to the first opening, on the preliminary seed layer; forming a preliminary plating layer in the second opening; removing the resist layer and etching the preliminary seed layer; forming a second preliminary dielectric layer on or covering the first preliminary dielectric layer; polishing the first preliminary dielectric layer, the preliminary plating layer, the second preliminary dielectric layer, and the plurality of preliminary through-electrodes, wherein a planar surface, including a first dielectric layer, a plating layer, a second dielectric layer, and a plurality of through-electrodes, is formed; and forming bump structures on the planar surface.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Hereinafter, example embodiments of the present inventive concept will be described with reference to the accompanying drawings.

Figure 1A:
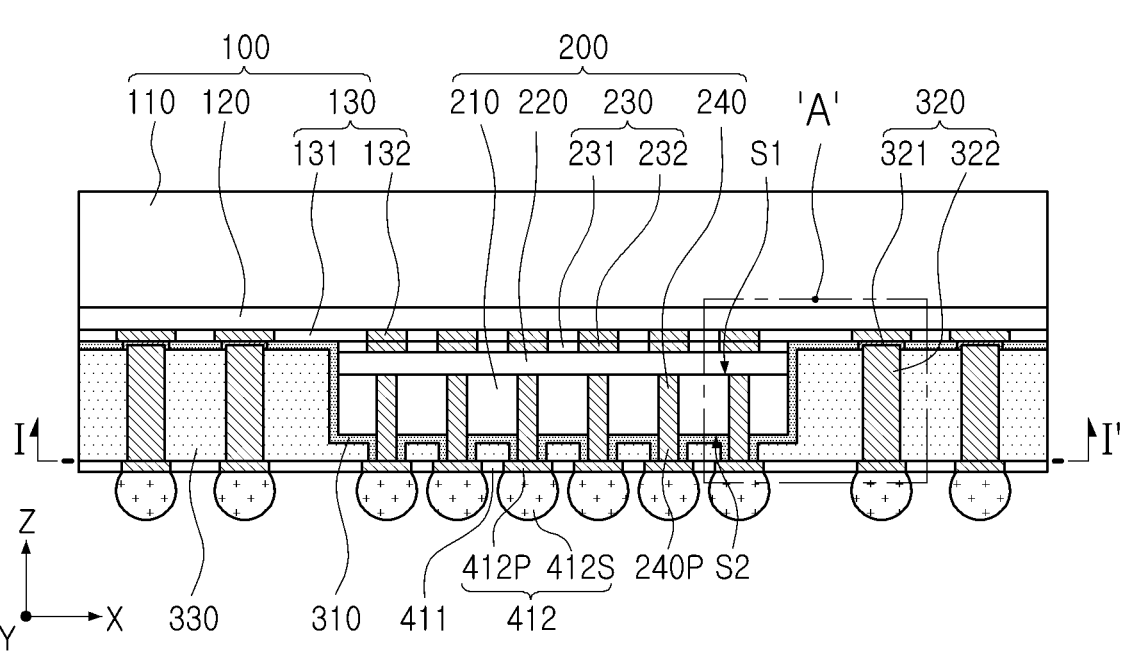
FIG. 1A is a cross-sectional view illustrating a semiconductor package according to an example embodiment of the present invention.
Figure 1B:
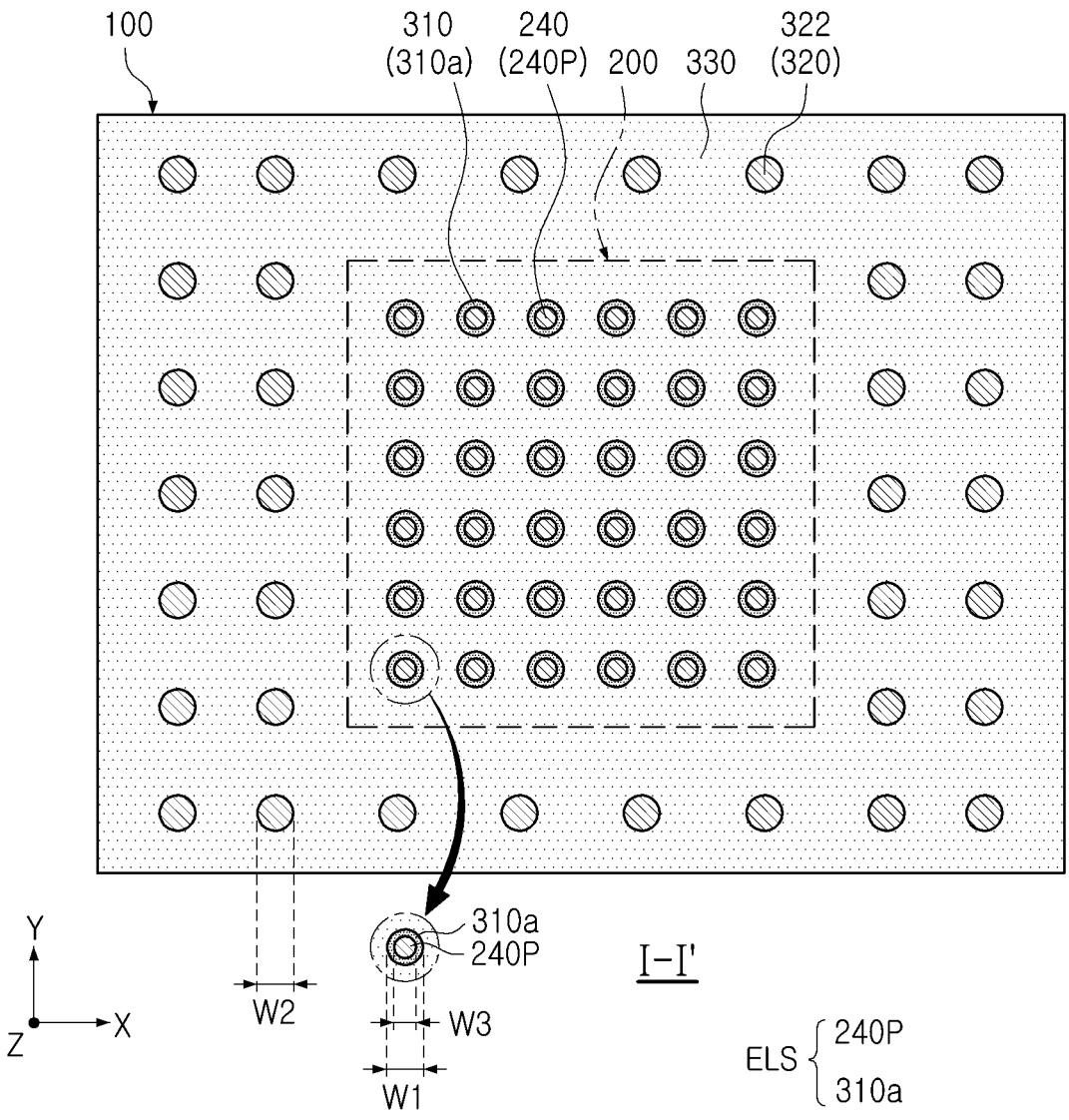
FIG. 1B is a plan view illustrating a cross-section taken along line I-I' in FIG. 1A.
Figure 1C:
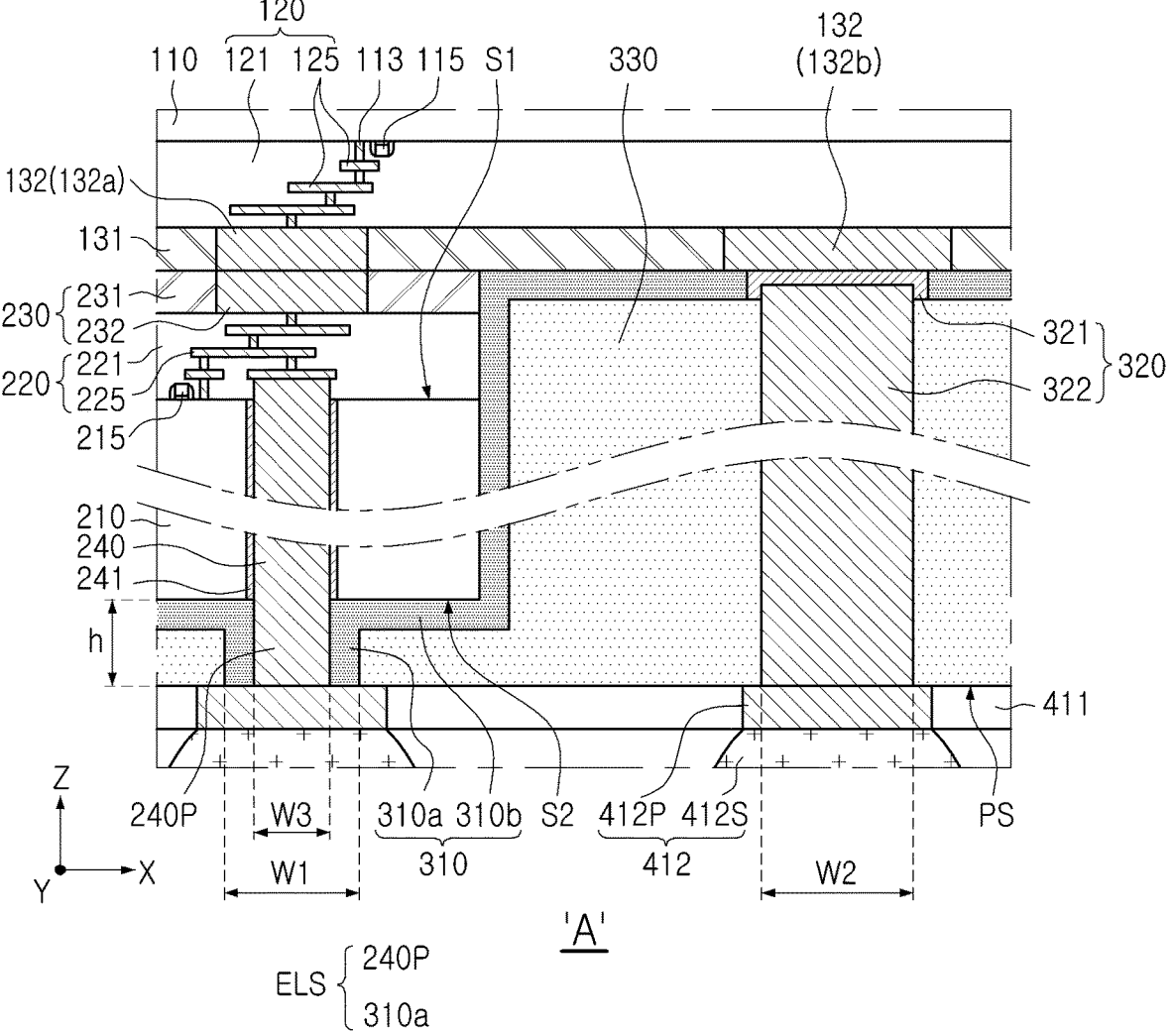
FIG. 1C is a partially enlarged view illustrating region 'A' of FIG. 1A.

FIG. 1A is a cross-sectional view illustrating a semiconductor package 10A according to an example embodiment of the present inventive concept, FIG. 1B is a cross-sectional view taken along line I-I' of FIG. 1A, and FIG. 1C is a partially enlarged view illustrating region 'A' of FIG. 1A.

Referring to FIGS. 1A to 1C, a semiconductor package 10A according to an example embodiment may include a first semiconductor chip 100, a second semiconductor chip 200, a first dielectric layer 310, and a second dielectric layer 330. According to an example embodiment, the semiconductor package 10A may further include through-via structures 320 and/or bump structures 412.

According to the present inventive concept, a signal transmission path between the first semiconductor chip 100 and the second semiconductor chip 200 may be minimized by bonding the active surface of the first semiconductor chip 100 and the active surface of the second semiconductor chip 200 to each other. The first semiconductor chip 100 and the second semiconductor chip 200 may be a logic chip including a central processor (CPU), a graphics processor (GPU), a field programmable gate array (FPGA), a digital signal processor (DSP), an encryption processor, a microprocessor, a microcontroller, an analog-to-digital converter, or the like, or a memory chip including a volatile memory (e.g., DRAM), a non-volatile memory (e.g., ROM and flash memory), or the like. For example, the first semiconductor chip 100 may include a logic circuit such as an application specific semiconductor (ASIC), and the second semiconductor chip 200 may include a cache memory providing cache information to the first semiconductor chip 100. A size of the second semiconductor chip 200 may be smaller than a size of the first semiconductor chip 100. For example, the second semiconductor chip 200 may have a planar area substantially equal to or smaller in size than that of the first semiconductor chip 100.

In addition, the first semiconductor chip 100 and the second semiconductor chip 200 may be directly bonded and coupled without a separate connection member (e.g., solder bumps, copper posts, etc). This structure may be referred to as hybrid bonding, or direct bonding, or the like, consisting of metal bonding by pads bonded to each other and dielectric bonding by insulating layers bonded to each other.

Further, by sealing the first semiconductor chip 100 and the second semiconductor chip 200 using the second dielectric layer 330 including an insulating resin, a level of difficulty a planarization process may be reduced and a yield may be improved. In addition, by using the first dielectric layer 310 formed of a material, different from that of the second dielectric layer 330, to surround through-electrodes

240, it is possible to protect and support the through-electrodes 240 during the planarization process. The "planarization process" may include a series of processes for forming a planar surface including a lowermost surface of the through-electrodes 240, a lowermost surface of the through-via structures 320, a lowermost surface of the first dielectric layer 310, and a lowermost surface of the second dielectric layer 330, for example, a grinding process, a polishing process, and the like. In this case, the lowermost surfaces of the through-electrodes 240, the lowermost surface of the through-via structures 320, the lowermost surface of the first dielectric layer 310, and the lowermost surface of the second dielectric layer 330 may be substantially on the same plane (e.g., 'PS' in FIG. 1C).

Hereinafter, components of the semiconductor device 10A according to an example embodiment will be described in detail.

The first semiconductor chip 100 may include a first substrate 110, a first circuit layer 120, a first insulating layer 131, and first pads 132. For example, the first semiconductor chip 100 may have a flat lower surface provided by the first insulating layer 131 and the first pads 132.

The first substrate 110 may be a semiconductor wafer including a semiconductor element such as silicon and germanium, or a compound semiconductor such as silicon carbide (SiC), gallium arsenide (GaAs), indium arsenide (InAs), and indium phosphide (InP). The first substrate 110 may have an active surface (e.g., a surface facing a first circuit layer 120) having an active region doped with impurities and an inactive surface opposite thereto.

The first circuit layer 120 is disposed on a lower surface of the first substrate 110, and may include an interlayer insulating layer 121 and an interconnection structure 125. The interlayer insulating layer 121 may include Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, or a combination thereof. At least a portion of the interlayer insulating layer 121 surrounding the interconnection structure 125 may be configured as a low-x layer. The interlayer insulating layer 121 may be formed using a chemical vapor deposition (CVD) process, a flowable-CVD process, or a spin coating process.

The interconnection structure 125 may be formed of a multilayer structure including an interconnection pattern and a via including, for example, aluminum (Al), gold (Au), cobalt (Co), copper (Cu), nickel (Ni), lead (Pb), tantalum (Ta), tellurium (Te), titanium (Ti), tungsten (W), or a combination thereof. A barrier film including titanium (Ti), titanium nitride (TiN), tantalum (Ta), or tantalum nitride (TaN) may be disposed between the interconnection pattern or/and the via and the interlayer insulating layer 121. Individual devices 115 constituting an integrated circuit may be disposed on a lower surface (or an active surface) of the first substrate 110. In this case, the interconnection structure 125 may be electrically connected to the individual devices 115 by an interconnection portion or interconnection member 113 (e.g., a contact plug). The individual devices 115 may include a FET such as a planar FET, a FinFET, or the like, a memory device such as a flash memory, DRAM, SRAM, EEPROM, PRAM, MRAM, FeRAM, RRAM, or the like, a logic device such as AND, OR, NOT, or the like, and various active and/or passive components such as system LSI, CIS, MEMS, or the like.

The first insulating layer 131 may be disposed below the first circuit layer 120 to surround the first pads 132. The first insulating layer 131 may include at least one of a material, capable of being bonded to and coupled to a second insulating layer 231 of the second semiconductor chip 200, for example, silicon oxide (SiO), silicon nitride (SiN), and silicon carbonitride (SiCN). That is, at least a portion of the first insulating layer 131 may be bonded to the second insulating layer 231 to form a bonding surface between the first semiconductor chip 100 and the second semiconductor chip 200.

The first pads 132 may be connection terminals electrically connected to the interconnection structure 125 of the first circuit layer 120. At least a portion of the first pads 132 may be dummy pads insulated from the interconnection structure 125. The first pads 132 may include first pads 132a of a first group disposed on a lower surface of the first semiconductor chip 100 and second pads 132b of a second group. The first pads 132a of the first group may be connected to second pads 232 of the second semiconductor chip 200. The first pads 132b of the second group may be connected to the through-via structures 320. The first pads 132a of the first group may be disposed to overlap or be aligned with the second semiconductor chip 200 in a direction (Z-axis direction), perpendicular to the lower surface of the first semiconductor chip 100. The first pads 132 may include any one of copper (Cu), nickel (Ni), titanium (Ti), aluminum (Al), gold (Au), and silver (Ag) or alloys thereof. The first pads 132 may form a bonding surface between the first semiconductor chip 100 and the second semiconductor chip 200 together with the first insulating layer 131. A barrier layer including at least one of titanium (Ti), titanium nitride (TiN), tantalum (Ta), and tantalum nitride (TaN) may be disposed between the first insulating layer 131 and the first pads 132.

The second semiconductor chip 200 may be disposed below the first semiconductor chip 100, and may include a second substrate 210 having a front surface S1 and a rear surface S2, opposing each other, a second circuit layer 220, a second insulating layer 231, second pads 232, and through-electrodes 240. The second semiconductor chip 200 may be provided by the second insulating layer 231 and the second pads 232, and may have a flat upper surface, in contact with the lower surface of the first semiconductor chip 100. According to an example embodiment, the second semiconductor chip 200 may be provided in the number of layers, smaller than that illustrated in the drawing. For example, the second semiconductor chip 200 may be provided as two or more semiconductor chips disposed horizontally below the first semiconductor chip 100. The second semiconductor chip 200 may be provided as a plurality of semiconductor chips stacked below the first semiconductor chip 100 in a vertical direction (Z-axis direction).

The second semiconductor chip 200 may have a structure, which is substantially the same as or similar to that of the first semiconductor chip 100, the same or similar components may be denoted by the same or similar reference numerals, and repeated descriptions of the same components may be omitted hereinafter in the interest of brevity. For example, since the second substrate 210 and the second circuit layer 220 have the same or similar characteristics to the first substrate 110 and the first circuit layer 120, described above, components corresponding to each other are indicated by similar reference numerals, and overlapping descriptions may be omitted.

The second insulating layer 231 may be disposed on the second circuit layer 220 and be formed to surround the second pads 232. The second insulating layer 231 may include a material, capable of being bonded to and coupled to the first insulating layer 131, for example, at least one of silicon oxide (SiO), silicon nitride (SiN), and silicon carbonitride (SiCN).

The second pads 232 may be disposed on the front surface S1 of the second substrate 220, and may be connection terminals electrically connected to an interconnection structure 225 of the second circuit layer 220. The second pads 232 may form a bonding surface between the first semiconductor chip 100 and the second semiconductor chip 200 together with the second insulating layer 231. The second pads 232 may include any one of copper (Cu), nickel (Ni), titanium (Ti), aluminum (Al), gold (Au), and silver (Ag) or alloys thereof. For example, the second pads 232 may be bonded and coupled to the first pads 132.

The through-electrodes 240 may be electrically connected to the interconnection structure 225 of the second circuit layer 220 and the second pads 232. The through-electrodes 240 may penetrate through the second substrate 210 and protrude to or through a rear surface S2 of the second substrate 210. For example, the through-electrode 240 may have a protruding portion 240P protruding from the rear surface S2 of the second substrate 210. The through-electrodes 240 may be connected to bump structures 412 through the protruding portion 240P.

The through-electrodes 240 may include a via plug and a side barrier film surrounding a side surface of the via plug. The via plug may include, for example, tungsten (W), titanium (Ti), aluminum (Al), or copper (Cu), and may be formed by a plating process, a PVD process, or a CVD process. The side barrier film may include titanium (Ti), titanium nitride (TiN), tantalum (Ta), or tantalum nitride (TaN), and may be formed by a plating process, a PVD process, or a CVD process. A side insulating film 241 including an insulating material such as silicon oxide, silicon nitride, silicon oxynitride, or the like (e.g., High Aspect Ratio Process (HARP) oxide) may be formed between through-electrodes 240 and the second substrate 210.

The first dielectric layer 310 may be formed to cover surfaces of the first semiconductor chip 100 and the second semiconductor chip 200. For example, the first dielectric layer 310 may cover a lower surface of the first semiconductor chip 100, a side surface and a lower surface of the second semiconductor chip 200, and side surfaces of the protruding portions 240P of the through-electrodes 240. The first dielectric layer 310 may include materials having greater flatness and resistance to processing than the insulating resin constituting the second dielectric layer 330, for example, at least one of silicon oxide (SiO), silicon nitride (SiN), and silicon carbonitride (SiCN).

The first dielectric layer 310 may extend along the rear surface S2 of the second substrate 210 and side surfaces of the protruding portions 240P to protect and support the through-electrodes 240 in the planarization process. For example, the first dielectric layer 310 may include a first portion 310a surrounding a side surface of the protruding portion 240P and a second portion 310b extending from one end of the first portion 310a to cover the rear surface S2 of the second substrate 220. The first portion 310a may extend along the side surfaces of the protruding portions 240P (e.g., in a first direction (Z-direction), perpendicular to the rear surface S2), and the second portion 310b may extend along the rear surface S2 of the second substrate 220 (e.g., in a second direction (X or Y-direction), parallel to the rear surface S2 from one end of the first portion 310a.

The first portion 310a of the first dielectric layer 310 may form an electrode structure ELS exposed from the second dielectric layer 330 together with the protruding portion 240P of the through-electrode 240. The first dielectric layer 310 may increase an aspect ratio of the protruding portion 240P to secure stability of the protruding portion 240P in a planarization process. Accordingly, the electrode structure ELS may have a width W1, equal to or greater than a height h of the protruding portion 240P in a second direction (X or Y-direction). For example, the height h of the protruding portion 240P may be within a range of about 1 μm to about 5 μm, and the width W1 of the electrode structure ELS may be within a range of about 4 μm to about 13 μm. A thickness of the first dielectric layer 310 may be within a range of about 1 μm to about 3 μm, but is not limited thereto, and may be variously changed according to the height h and width W3 of the protruding portion 240P.

The through-via structures 320 may be disposed around the second semiconductor chip 200, and may be in contact with the first pads 132. The through-via structures 320 may be electrically connected to the interconnection structure 125 of the first circuit layer 120. According to an example embodiment, at least a portion of the through-via structures 320 may be dummy vias, electrically insulated from the interconnection structure 125 or the individual devices 115. The through-via structures 320 may be disposed in an opening ('OP1' of FIG. 6C) of the first dielectric layer 310 exposing at least a portion of the first pads 132. Each of the through-via structures 320 may include a seed layer 321 extending along an inner wall of the opening OP1 and a plating layer 322 extending downwardly from the seed layer 321. The seed layer 321 may include copper (Cu), titanium (Ti), a copper (Cu) alloy, or a titanium (Ti) alloy, and the plating layer 322 may include copper (Cu) or a copper (Cu) alloy. The through-electrodes 240 may have a width W3, which may be narrower than a width W2 of the through-via structures 320. For example, the width W3 of the through-electrodes 240 may be within a range of about 1 μm to about 10 μm, and the width W2 of the through-via structures 320 is within a range of about 4 μm to about 40 μm.

The second dielectric layer 330 may be disposed below the first dielectric layer 310, and cover or surround at least a portion of each of the first semiconductor chip 100 and the second semiconductor chip 200. The second dielectric layer 330 may fill a space between the protruding portions 240P of the through-electrodes 240 and a space between the through-via structures 320. For example, the second dielectric layer 330 may be in contact with the first portion 310a and the second portion 310b of the first dielectric layer 310, and a side surface of the through-via structure 320 (or the plating layer 322). The second dielectric layer 330 may include a material, different from that of the first dielectric layer 310, for process simplification. The second dielectric layer 330 may include an insulating resin, for example, a thermosetting resin such as an epoxy resin, a thermoplastic resin such as polyimide, or a material impregnated with inorganic fillers or/and glass fibers (Glass Fiber, Glass Cloth, Glass Fabric), for example, prepreg, Ajinomoto Build-up Film (ABF), FR-4, Bismaleimide Triazine (BT), Epoxy Molding Compound (EMC), and the like.

The bump structures 412 may be disposed below the second dielectric layer 330, and may be electrically connected to the through-electrodes 240 and the through-via structures 320. The semiconductor package 10A may be connected to an external device such as a module substrate, a system board, or the like, through the bump structures 412. As an example, the bump structures 412 may include a pillar portion 412P and a solder portion 412S. The pillar portion 412P may include copper (Cu) or an alloy of copper (Cu), and the solder portion 412S may include a low-melting point metal, for example, tin (Sn) or an alloy (Sn—Ag—Cu) including tin (Sn). According to an example embodiment, the bump structures 412 may include only the pillar portion 412P or only the solder portion 412S. A protective layer 411 surrounding the bump structures 412 may be formed below the second dielectric layer 330. The protective layer 411 may protect the bump structures 412 from external physical/chemical damage. The protective layer 411 may be formed using prepreg, ABF, FR-4, BT, photo-imageable dielectric (PID), photo solder resist, or the like. According to an example embodiment, the protective layer 411 may be formed to cover a lower or side surface of the pillar portion 412P or may be omitted.

Figure 2:
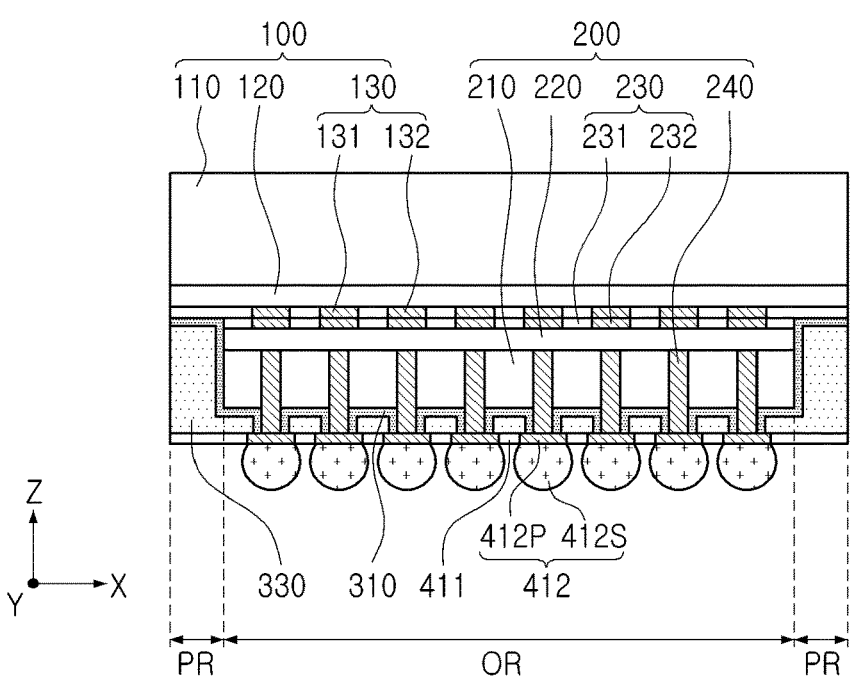
FIG. 2 is a cross-sectional view illustrating a semiconductor package according to an example embodiment of the present inventive concept.

FIG. 2 is a cross-sectional view illustrating a semiconductor package 10B according to an example embodiment of the present inventive concept.

Referring to FIG. 2, the semiconductor package 10B according to an example embodiment may have the same or similar characteristics as those described with reference to FIGS. 1A to 1C, except that the through via structures 320 of FIG. 1A are not included. The semiconductor package 10B of the present example embodiment may have an overlapping region OR in which the first semiconductor chip 100 and the second semiconductor chip 200 vertically overlap or align with each other and a peripheral region PR located outside the overlapping region OR. For example, a width of the second semiconductor chip 200 in a horizontal direction (X or Y-direction) may be equal to or narrower than a width of the first semiconductor chip 100. The first pads 132 of the first semiconductor chip 100 may be disposed in the overlapping region OR, and may not be disposed in the peripheral region PR. However, according to an example embodiment, dummy pads electrically insulated from the first circuit layer 120 may be disposed in the peripheral region PR. As described above, the through-via structures 320 of FIG. 1A may be omitted depending on the size and type of the first semiconductor chip 100 and the second semiconductor chip 200.

Figure 3:
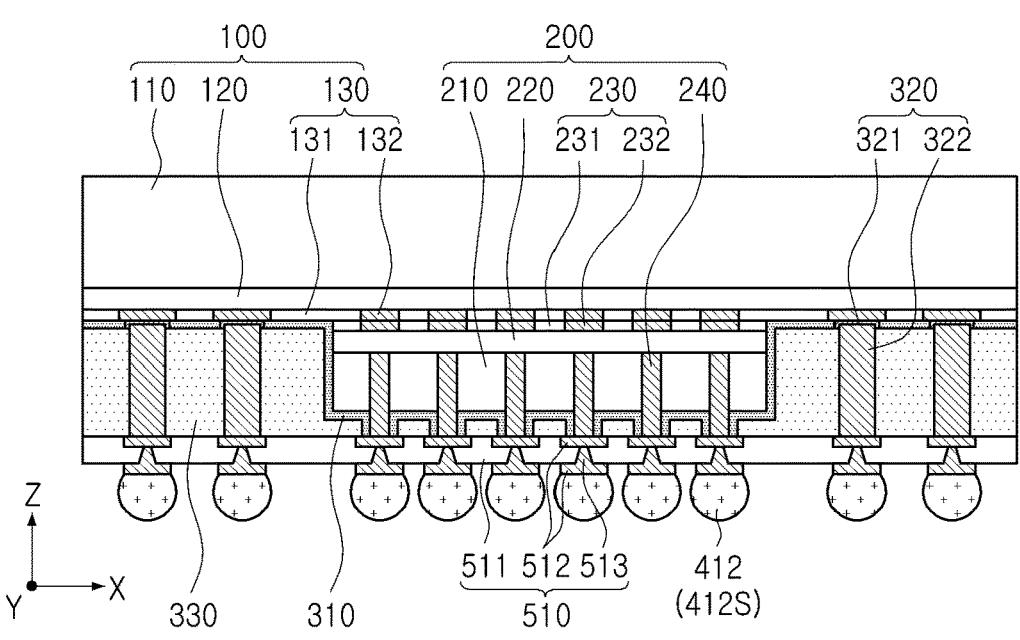
FIG. 3 is a cross-sectional view illustrating a semiconductor package according to an example embodiment of the present inventive concept.

FIG. 3 is a cross-sectional view illustrating a semiconductor package 10C according to an example embodiment of the present inventive concept.

Referring to FIG. 3, the semiconductor package 10C according to an example embodiment may have the same or similar characteristics as those described with reference to FIGS. 1A to 2, except that a redistribution structure 510 redistributing the through-electrodes 240 and/or the through-via structures 320 are further included. The redistribution structure 510 is disposed below the second dielectric layer 330, and may include an insulating material layer 511, a redistribution pattern layer 512, and a redistribution via 513.

The redistribution pattern layer 512 according to the present example embodiment may be directly disposed on a surface of the second dielectric layer 330. For example, the redistribution pattern layer 512 may include an upper pattern layer, being directly in contact with the second dielectric layer 330 and the first dielectric layer 310 and buried in the insulating material layer 511, and a lower pattern layer disposed below the insulating material layer 511. In this case, the redistribution via 513 may penetrate through the insulating material layer 511 to connect the lower pattern layer and the upper pattern layer. As described above, by introducing the redistribution structure 510, a layout of the bump structures 412 may be designed.

The insulating material layer 511 may be formed using a dielectric material such as silicon oxide, silicon nitride, or silicon oxynitride, or a photosensitive resin such as a photo-imageable dielectric (PID). The insulating material layer 511 may be formed in a plurality of layers according to the number of layers of the redistribution pattern layer 512. Depending on the process, a boundary between at least a portion of the plurality of insulating material layers 511 may not be clear.

The redistribution pattern layer 512 may be electrically connected to the first semiconductor chip 100 and the second semiconductor chip 200, and a metal material for example, copper (Cu), aluminum (Al), silver (Ag), tin (Sn), gold (Au), nickel (Ni), lead (Pb), titanium (Ti), or alloys thereof may be included. The redistribution pattern layer 512 may include, for example, a ground pattern, a power pattern, and a signal pattern. The signal pattern may transmit a data signal transmitted from the first semiconductor chip 100 and the second semiconductor chip 200 externally or transmit the data signal transmitted from the outside to the first semiconductor chip 100 and the second semiconductor chip 200. According to an example embodiment, at least a portion of the power pattern and/or the ground pattern may be connected to the first semiconductor chip 100 through the through-via structure 320. The redistribution pattern layer 512 may be formed in more or less number of layers than that illustrated in the drawing (two layers). For example, the redistribution pattern layer 512 may extend in a horizontal direction (e.g., in X and Y-directions) between the bump structure 412 and the second dielectric layer 330, so that the redistribution pattern layer 512 may be provided as three or more pattern layers for redistributing the through-electrodes 240 and the through-via structures 320.

The redistribution via 513 may penetrate through the insulating material layer 511 to be connected to the redistribution pattern layer 512. The redistribution via 513 may have a form of a filled via in which a metal material is filled inside a via hole or a conformal via in which a metal material is formed along an inner wall of the via hole. The redistribution via 513 may be integrated with the redistribution pattern layer 512, but example embodiments of the present inventive concept are not limited thereto. The redistribution via 513 may correspond to the redistribution pattern layer 512, so that the redistribution via 513 may be formed in the number of layers, greater than that illustrated in the drawing (one layer).

In the drawing, the bump structure 412 may include only a solder portion 412S, but according to an example embodiment, the bump structure 412 may include a pillar portion ('412P' in FIG. 1A) and a protective layer ('411' in FIG. 1A) surrounding the bump structure 412 may be formed.

Figure 4:
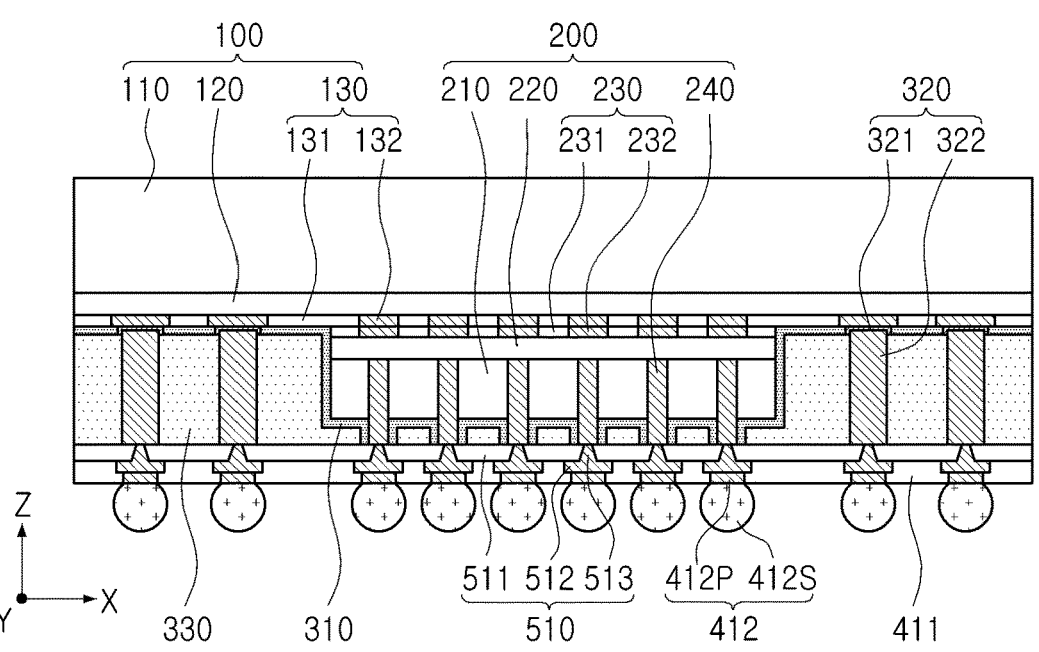
FIG. 4 is a cross-sectional view illustrating a semiconductor package according to an example embodiment of the present inventive concept.

FIG. 4 is a cross-sectional view illustrating a semiconductor package 10D according to an example embodiment of the present inventive concept.

Referring to FIG. 4, the semiconductor package 10D according to an example embodiment may have the same or similar characteristics as described with reference to FIG. 3, except that the redistribution pattern layer 512 is spaced apart from the first dielectric layer 310 and the second dielectric layer 330. The redistribution structure 510 of the present example embodiment may include an insulating material layer 511 disposed directly on a lower surface of the first and second dielectric layers 310 and 330, a redistribution pattern layer 512 disposed below the insulating material layer 511, and a redistribution via 513 penetrating through the insulating material layer 511 to connect the redistribution pattern layer 512 to the through-electrodes 240 and/or the through-via structures 320. As described above, by forming the redistribution pattern layer 512 on the insulating material layer 511, adhesion of the redistribution pattern layer 512 can be secured, and the redistribution pattern layer 512 can be implemented with a fine pitch. In the drawing, the bump structure 412 may include both a pillar portion 412P and a solder portion 412S, but depending on the example embodiment, any one thereof may be omitted.

Figure 5:
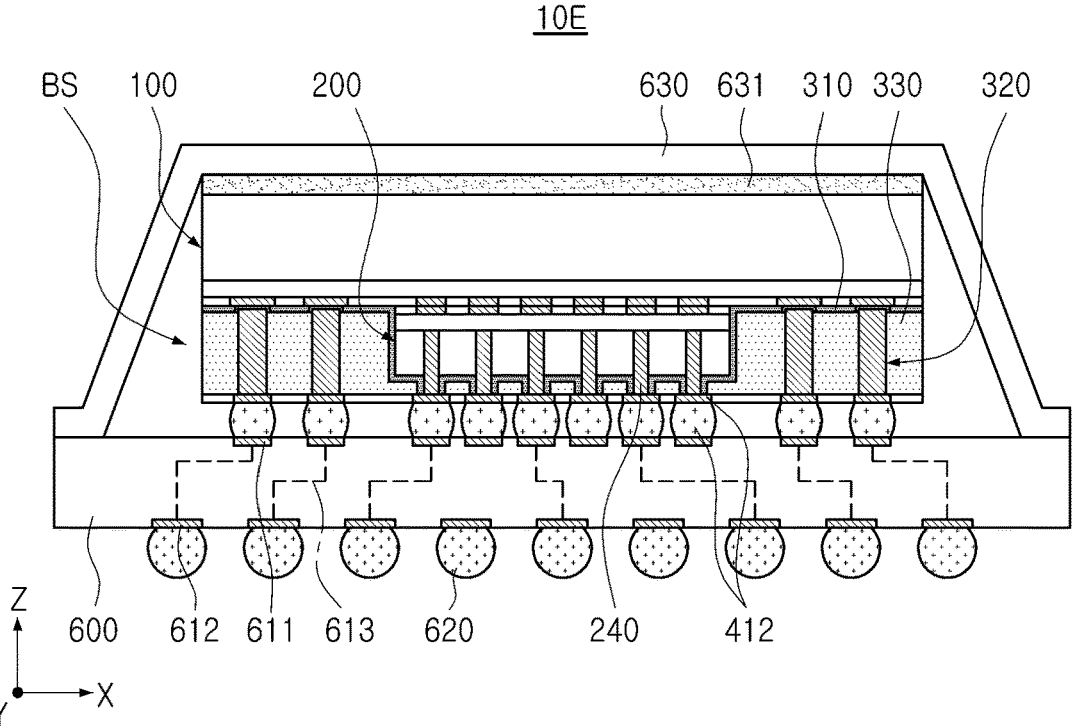
FIG. 5 is a cross-sectional view illustrating a semiconductor package according to an example embodiment of the present inventive concept.

FIG. 5 is a cross-sectional view illustrating a semiconductor package 10E according to an example embodiment of the present inventive concept.

Referring to FIG. 5, the semiconductor package 10E according to an example embodiment may include a bonding structure BS, an interconnection substrate 600, and a heat dissipation structure 630. The bonding structure BS may include a first semiconductor chip 100, a second semiconductor chip 200, a first dielectric layer 310, a second dielectric layer 330, and the like, and may have the same or similar characteristics as those described with reference to FIGS. 1A to 4.

The interconnection substrate 600 is a support substrate on which the bonding structure BS is mounted, and may be a substrate for a semiconductor package such as a printed circuit board (PCB), a ceramic substrate, a tape interconnection substrate, and the like. The interconnection substrate 600 may include a body, a lower pad 612 disposed on a lower surface of the body, an upper pad 611 disposed on an upper surface of the body, and an interconnection circuit 613 electrically connecting the lower pad 612 and the upper pad 611. The body of the interconnection substrate 600 may include different materials depending on the type of the substrate. For example, when the interconnection substrate 600 is a printed circuit board, the interconnection substrate may have a form in which an interconnection layer is additionally laminated on one side or both sides of a body copper clad laminate or a copper clad laminate. The upper pad 611, the lower pad 612, and the redistribution circuit 613 may form an electrical path connecting a lower surface and an upper surface of the interconnection substrate 600. An external connection bump 620 connected to the lower pad 612 may be disposed on the lower surface of the interconnection substrate 600. The external connection bump 620 may include tin (Sn), indium (In), bismuth (Bi), antimony (Sb), copper (Cu), silver (Ag), zinc (Zn), lead (Pb) and/or alloys thereof.

The heat dissipation structure 630 may be disposed on an upper surface of the interconnection substrate 600, and may be formed to cover an upper portion of the bonding structure BS. The heat dissipation structure 630 may be attached to the interconnection substrate 600 by an adhesive. As the adhesive, a thermally conductive adhesive tape, a thermally conductive grease, a thermally conductive adhesive, or the like may be used. The heat dissipation structure 630 may be attached to an upper surface of the bonding structure BS by an adhesive member 631 on the bonding structure BS. The heat dissipation structure 630 may include a conductive material having excellent thermal conductivity. For example, the heat dissipation structure 630 may include a metal or a metal alloy including gold (Au), silver (Ag), copper (Cu), iron (Fe), or the like, or a conductive material such as graphite, graphene, or the like. The heat dissipation structure 630 may have a shape different from that illustrated in the drawings. For example, the heat dissipation structure 630 may have a shape covering only the upper surface of the bonding structure.

FIGS. 6A to 6H are cross-sectional views illustrating a method of manufacturing the semiconductor package 10A illustrated in FIG. 1A according to a process sequence.

Figure 6A:
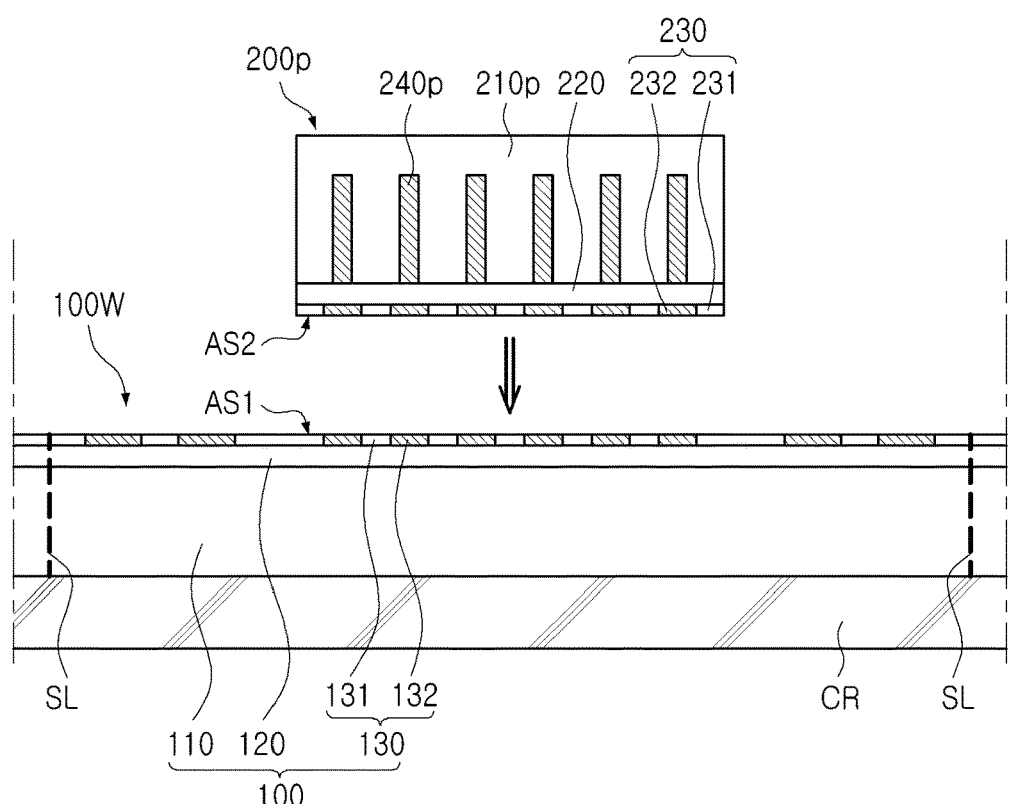
FIGS. 6A to 6H are cross-sectional views illustrating a method of manufacturing the semiconductor package illustrated in FIG. 1A according to a process sequence.

Referring to FIG. 6A, a semiconductor wafer 100W for a first semiconductor chip 100 may be prepared.

The semiconductor wafer 100W may include a plurality of first semiconductor chips 100 separated by a scribe line SL. The semiconductor wafer 100W may be in a state in which a first circuit layer 120 and a first bonding layer 130 for the first semiconductor chip 100 are formed on a first substrate 110. The first bonding layer 130 may include a first insulating layer 131 and first pads 132. The semiconductor wafer 100W may be disposed on a carrier CR such that a first active surface AS1 on which the first pads 132 are disposed faces upwardly.

Next, a second semiconductor chip 200p may be attached to the semiconductor wafer 100W.

The second semiconductor chip 200p may include a preliminary substrate 210p before a thickness thereof is adjusted by a backgrinding process, a second circuit layer 220 and a second bonding layer 230, disposed on a front surface of the preliminary substrate 210p, and a plurality of preliminary through-electrodes 240p buried in the substrate 210p. The second semiconductor chip 200p may be disposed on the semiconductor wafer 100W such that a second active surface AS2 on which second pads 232 are disposed faces downwardly. The second semiconductor chip 200p may be disposed such that the second active surface AS2 is in contact with the first active surface AS1.

Thereafter, the first semiconductor chip 100 and the second semiconductor chip 200 may be coupled by performing a thermal compression process. The thermocompression process may be performed in a thermal atmosphere within a range from about 100° C. to about 300° C. However, the temperature of the thermal atmosphere is not limited to the above-described range and may be variously changed.

Figure 6B:
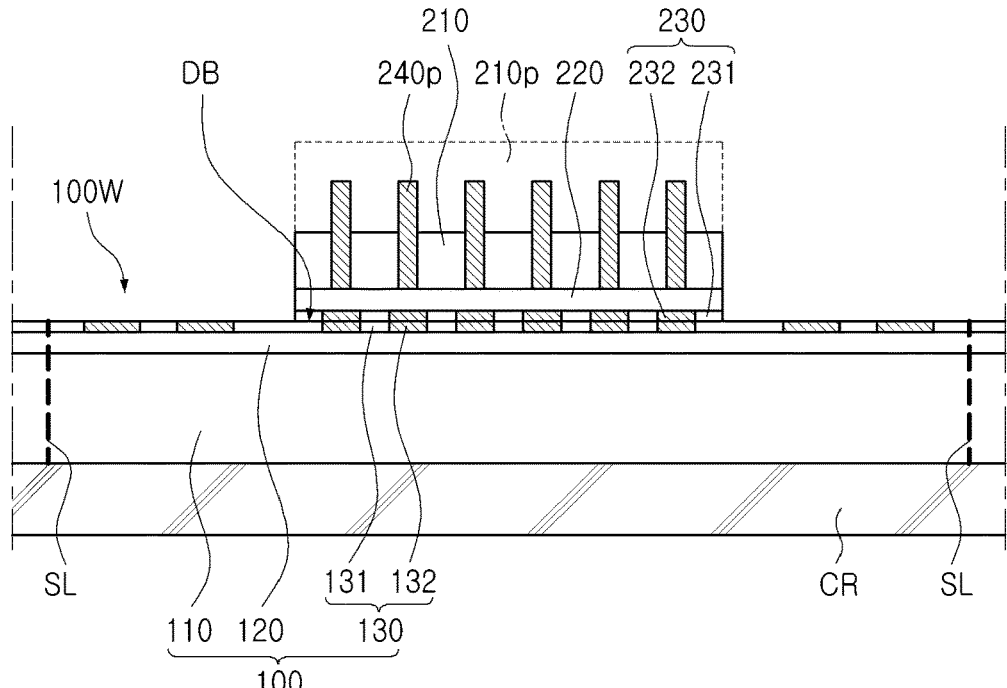

Referring to FIG. 6B, the preliminary substrate 210p may be etched to expose at least a portion of each of the plurality of preliminary through-electrodes 240p.

A substrate 210 having a desired thickness may be formed by applying a polishing process to the preliminary substrate 210p. The polishing process may be performed by a chemical mechanical polishing (CMP) process, an etch-back process, or a combination thereof. For example, the preliminary substrate 210p may be reduced to a predetermined thickness by performing a polishing process, and the plurality of preliminary through-electrodes 240p may be sufficiently exposed by applying an etch-back condition under an appropriate condition.

Figure 6C:
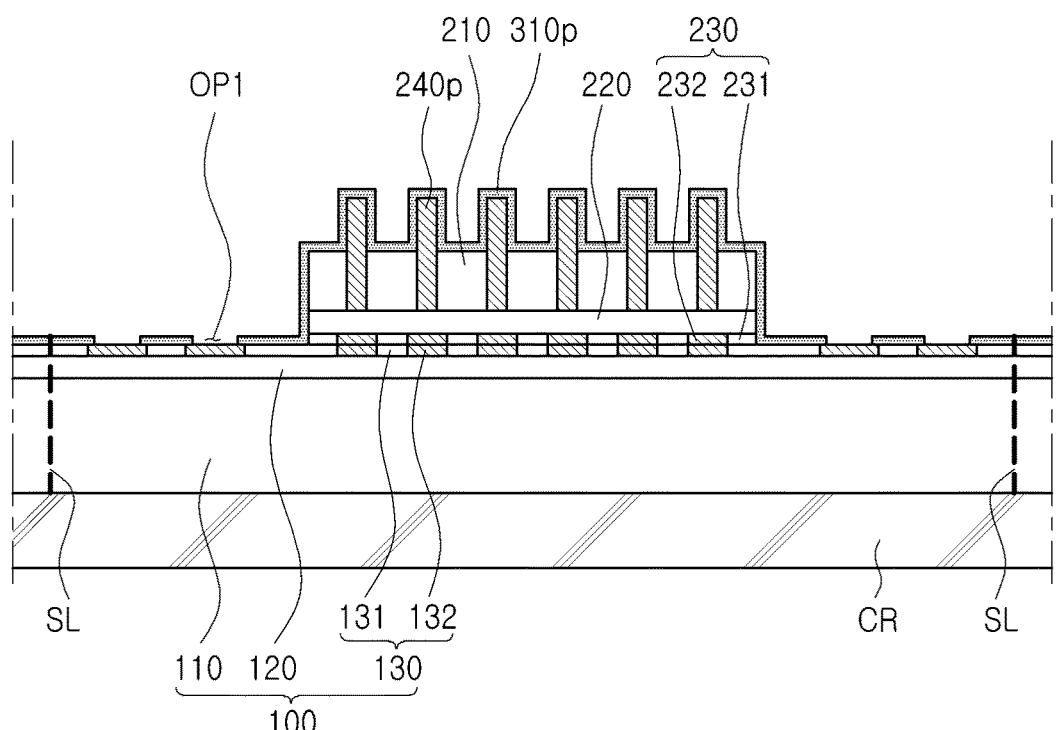

Referring to FIG. 6C, a first preliminary dielectric layer 310p covering the semiconductor wafer 100W, the second semiconductor chip 200p, and the plurality of exposed preliminary through-electrodes 240p may be formed.

The first preliminary dielectric layer 310p may have a first opening OP1 exposing at least a portion of the first pads 132. The first preliminary dielectric layer 310p may conformally extend along surfaces of the plurality of exposed preliminary through-electrodes 240p. The first preliminary dielectric layer 310p may include, for example, silicon oxide (SiO), and may be formed using a PVD or CVD process.

Figure 6D:
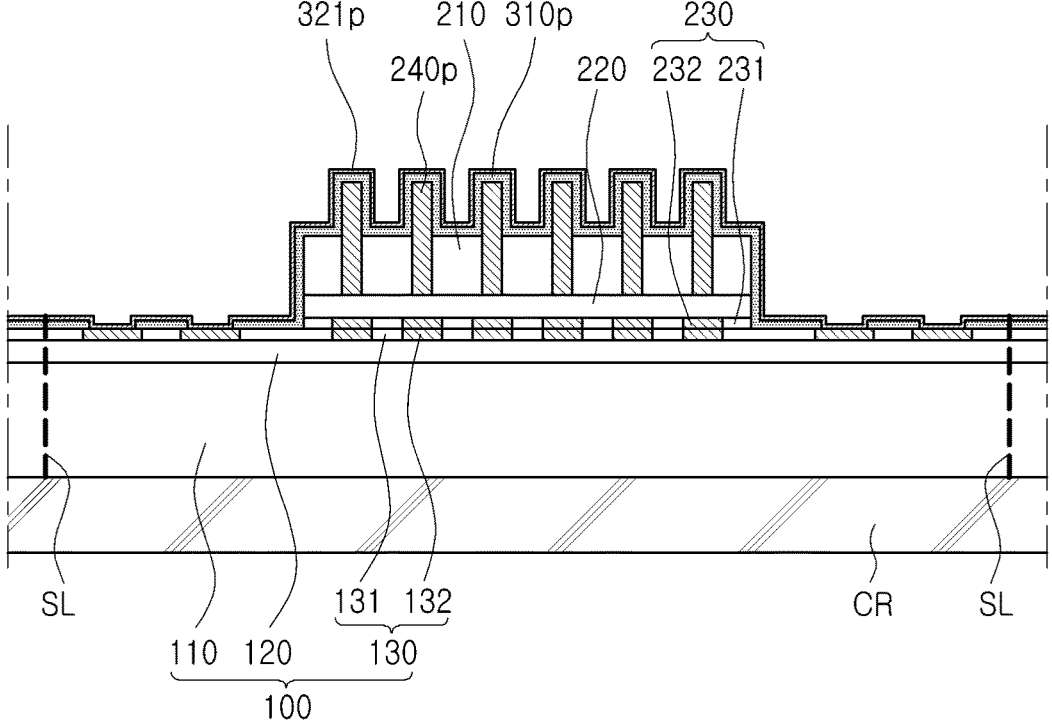

Referring to FIG. 6D, a preliminary seed layer 321p may be formed on the first preliminary dielectric layer 310p.

The preliminary seed layer 321p may conformally extend along a surface of the first preliminary dielectric layer 310p. The preliminary seed layer 321p may include, for example, titanium (Ti), copper (Cu), or the like, and may be formed using a plating process, a PVD process, or a CVD process.

A thickness of the preliminary seed layer 321p may be within a range of about 0.1 μm to about 0.3 μm, but an example embodiment thereof is not particularly limited.

Figure 6E:
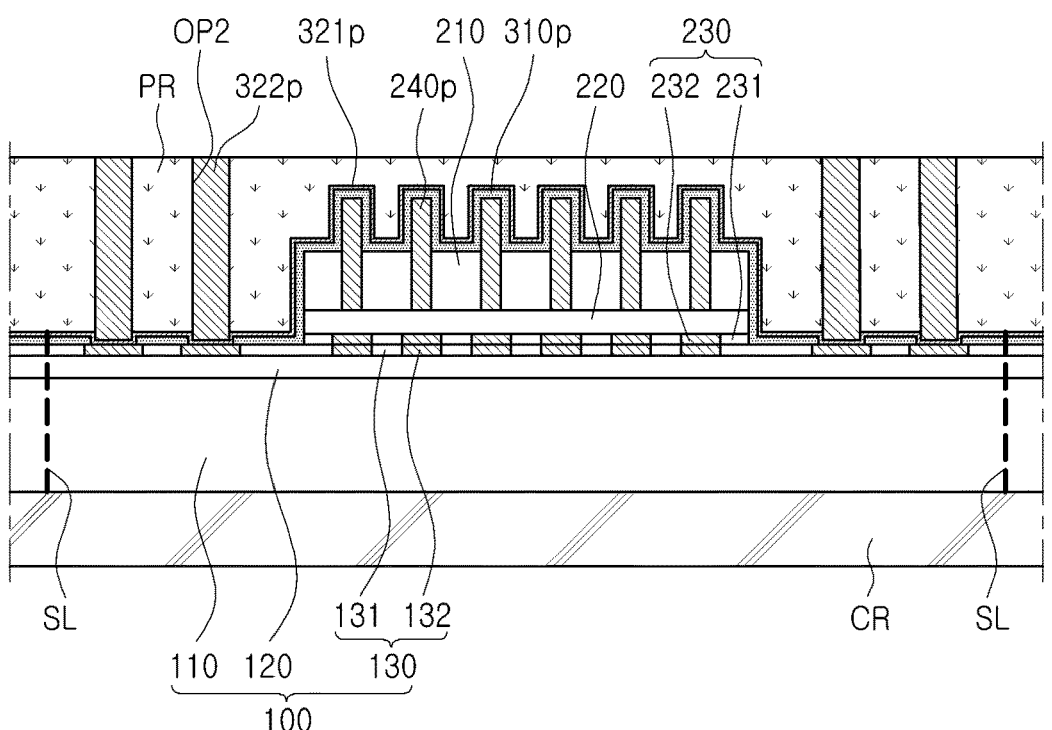

Referring to FIG. 6E, a resist layer PR having a second opening OP2 may be formed on the preliminary seed layer 321p, and a preliminary plating layer 322p may be formed in the second opening OP2.

The second opening OP2 may be formed at a position (e.g., horizontal position) corresponding to the first opening OP1. The second opening OP2 may have a width, equal to or greater than that of the first opening OP1, but an example embodiment thereof is not limited thereto. The resist layer PR may be formed by coating and curing a photosensitive material (e.g., photoresist) on the preliminary seed layer 321p and performing a photolithography process. The preliminary plating layer 322p may include, for example, copper (Cu) and may be formed using a plating process.

Figure 6F:
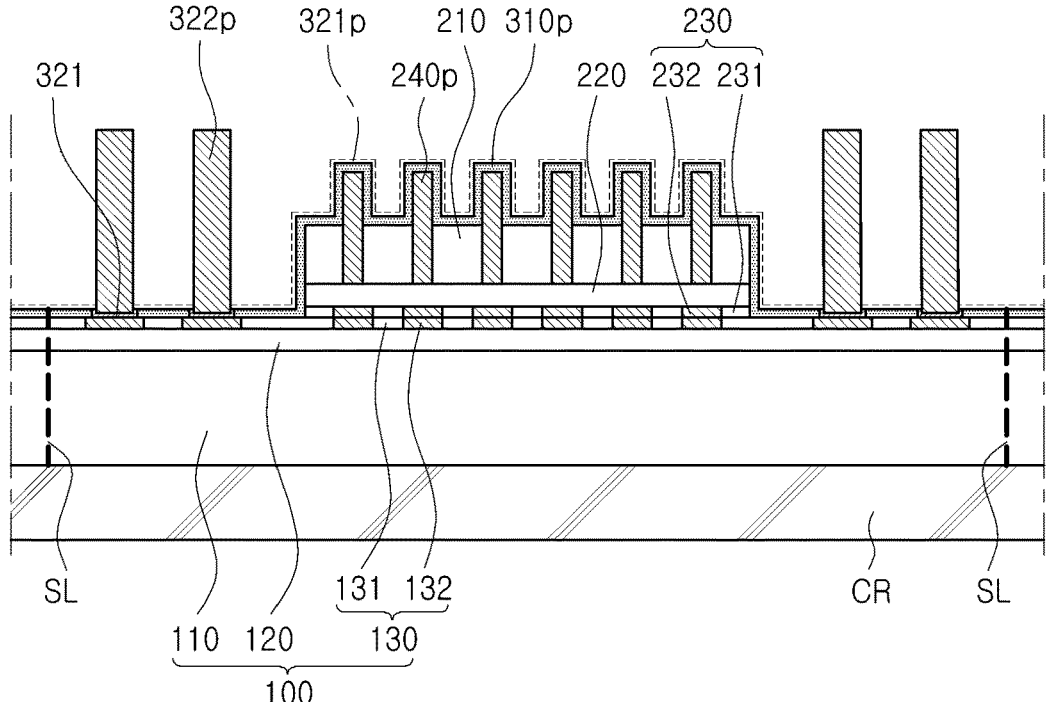

Referring to FIG. 6F, a resist layer ('PR' in FIG. 6E) may be removed and the preliminary seed layer 321p may be etched. For example, a portion of the preliminary seed layer 321p exposed from the preliminary plating layer 322p may be removed using a dry etching process, so that a seed layer 321 may be formed below the preliminary plating layer 322p.

Figure 6G:
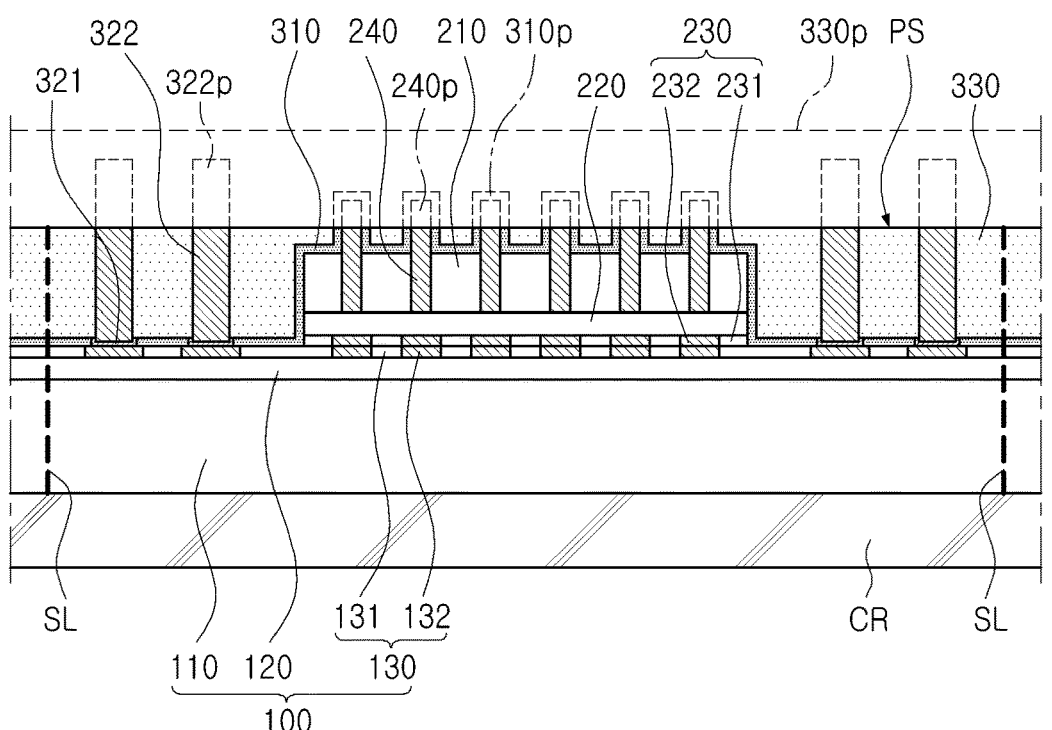

Referring to FIG. 6G, a second preliminary dielectric layer 330p covering the first preliminary dielectric layer 310p may be formed. Thereafter, by applying a polishing process to the second preliminary dielectric layer 330p, a planar surface PS including the second dielectric layer 330, the plating layer 322, the first dielectric layer 310, and the plurality of through-electrodes 240 may be formed. The second preliminary dielectric layer 330p may be formed by coating and curing a molding material, for example, EMC. The second preliminary dielectric layer 330p may cover the preliminary plating layer 322p and the preliminary through-electrodes 240p, and may fill spaces between the plurality of preliminary through-electrodes 240p surrounded by the first preliminary dielectric layer 310p. The first dielectric layer 310, from which a portion of the first preliminary dielectric layer 310p is removed, the plating layer 322, from which a portion of the preliminary plating layer 322p is removed, and the through-electrodes, from which portions of the preliminary through-electrodes 240p are removed, may be formed by an etching process. The first preliminary dielectric layer 310p may support and protect the preliminary through-electrodes 240p during the polishing process by surrounding the preliminary through-electrodes 240p protruding from the substrate 210.

Figure 6H:
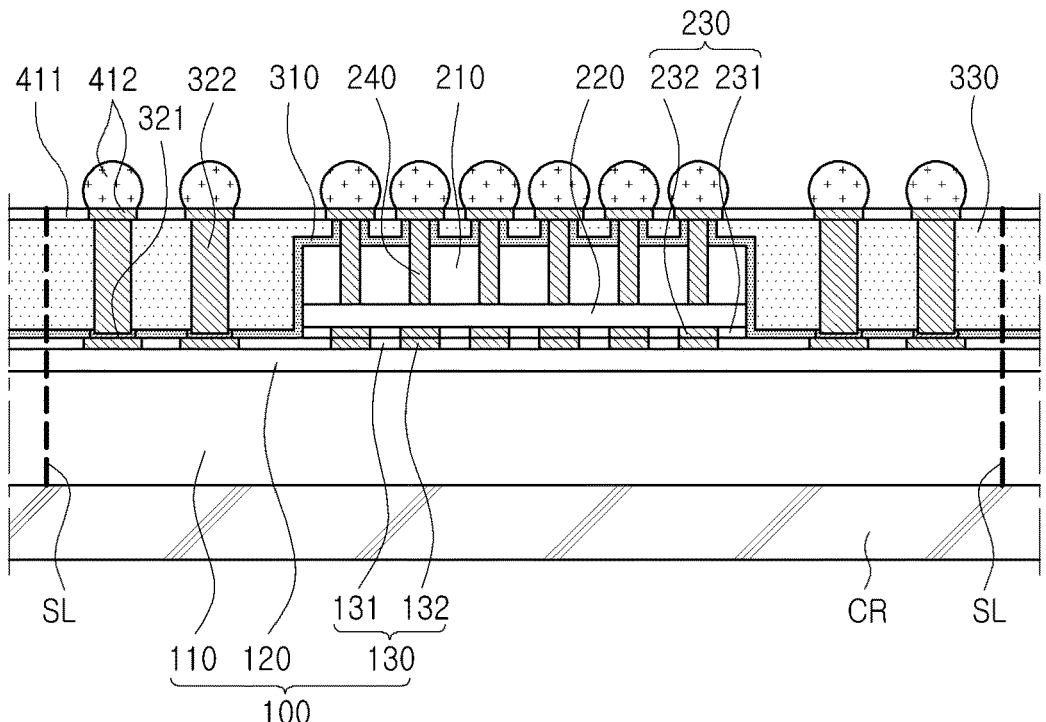

Referring to FIG. 6H, a protective layer 411 and bump structures 412 may be sequentially formed on a planar surface formed by a polishing process. The protective layer 411 may be formed using, for example, a photosensitive resin such as PID. The bump structures 412 may include a pillar portion and a solder portion. Thereafter, the semiconductor package of FIG. 1A may be formed by performing a cutting process along a scribe line SL.

As set forth above, according to example embodiments of the present inventive concept, by introducing a first dielectric layer and a second dielectric layer surrounding through-electrodes, it is possible to provide a semiconductor package and a method of manufacturing the same having a simplified process and improved yield.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

While example embodiments have been shown and described above, it will be apparent to those skilled in the art that modifications and variations could be made without departing from the scope of the present inventive concept as defined by the appended claims.

What is claimed is:

1. A semiconductor package, comprising:
a first semiconductor chip including first pads;
a second semiconductor chip below the first semiconductor chip, the second semiconductor chip including a substrate including a front surface and a rear surface opposing each other, second pads on the front surface and in contact with the first pads, and through-electrodes electrically connected to the second pads and including protruding portions protruding from the rear surface of the substrate;
through-via structures disposed around the second semiconductor chip and in contact with the first pads;
a first dielectric layer extending along the rear surface of the substrate and side surfaces of the protruding portions of the through-electrodes;
a second dielectric layer below the first dielectric layer and in a space between the protruding portions of the through-electrodes and between the through-via structures; and
bump structures below the second dielectric layer and electrically connected to the through-electrodes and the through-via structures.

2. The semiconductor package of claim 1, wherein the first dielectric layer has a first portion extending in a first direction along the side surfaces of the protruding portions of the through-electrodes and a second portion extending from the first portion in a second direction along the rear surface of the substrate.

3. The semiconductor package of claim 2, wherein the second dielectric layer is in contact with the first portion and the second portion of the first dielectric layer.

4. The semiconductor package of claim 1, wherein the first dielectric layer extends along a lower surface of the first semiconductor chip and a side surface of the second semiconductor chip and includes an opening exposing at least a portion of the first pads.

5. The semiconductor package of claim 4, wherein each of the through-via structures comprises a seed layer in the opening and a plating layer extending downwardly from the seed layer.

6. The semiconductor package of claim 5, wherein a side surface of the plating layer is in contact with the second dielectric layer.

7. The semiconductor package of claim 1, wherein the first dielectric layer comprises at least one of silicon oxide (SiO), silicon nitride (SiN), and silicon carbonitride (SiCN).

8. The semiconductor package of claim 1, wherein the second dielectric layer comprises an insulating resin.

9. The semiconductor package of claim 1, wherein the through-electrodes have a width narrower than a width of the through-via structures in a direction parallel to the rear surface of the substrate.

10. The semiconductor package of claim 9, wherein the width of the through-electrodes is within a range of about 1 μm to about 10 μm, and
the width of the through-via structures is within a range of about 4 μm to about 40 μm.

11. The semiconductor package of claim 1, wherein the first semiconductor chip further comprises a first insulating layer surrounding side surfaces of the first pads,
wherein the second semiconductor chip further comprises a second insulating layer surrounding side surfaces of the second pads and in contact with the first insulating layer.

12. The semiconductor package of claim 11, wherein the first insulating layer and the second insulating layer each comprise at least one of silicon oxide (SiO), silicon nitride (SiN), and silicon carbonitride (SiCN).

13. The semiconductor package of claim 1, wherein a lowermost surface of the through-electrodes, a lowermost surface of the through-via structures, a lowermost surface of the first dielectric layer, and a lowermost surface of the second dielectric layer are substantially coplanar.

14. A semiconductor package, comprising:
a first semiconductor chip including first pads;
a second semiconductor chip including a substrate including a front surface and a rear surface opposing each other, second pads on the front surface and in contact with the first pads, and a through-electrode electrically connected to the second pads and including a protruding portion protruding from the rear surface of the substrate;
a first dielectric layer including a first portion surrounding a side surface of the protruding portion of the through-electrode and a second portion extending from one end of the first portion along the rear surface of the substrate; and
a second dielectric layer covering the first portion and the second portion of the first dielectric layer.

15. The semiconductor package of claim 14, wherein the first portion of the first dielectric layer and the protruding portion of the through-electrode form an electrode structure extending through the second dielectric layer,
wherein the electrode structure has a width equal to or greater than a height of the protruding portion.

16. The semiconductor package of claim 14, wherein a thickness of the first dielectric layer is within a range of about 1 μm to about 3 μm,
wherein a width of the protruding portion of the through-electrode is within a range of about 1 μm to about 10 μm.

17. The semiconductor package of claim 14, wherein the first portion of the first dielectric layer extends in a first direction perpendicular to the rear surface of the substrate, and
the second portion of the first dielectric layer extends in a second direction parallel to the rear surface of the substrate.

18. A semiconductor package, comprising:
a first semiconductor chip including first pads;
a second semiconductor chip below the first semiconductor chip, the second semiconductor chip including a substrate having a front surface and a rear surface opposing each other, second pads on the front surface and electrically connected to the first pads, and through-electrodes electrically connected to the second pads and including protruding portions protruding from the rear surface through the substrate;
a first dielectric layer on a lower surface of the first semiconductor chip, a side surface and a lower surface of the second semiconductor chip, and side surfaces of the protruding portions of the through-electrodes;
a second dielectric layer below at least a portion of each of the first semiconductor chip and the second semiconductor chip and below the first dielectric layer, the second dielectric layer including a material different from a material of the first dielectric layer; and bump structures below the second dielectric layer and electrically connected to the through-electrodes.

19. The semiconductor package of claim 18, wherein the first dielectric layer comprises at least one of silicon oxide (SiO), silicon nitride (SiN), and silicon carbonitride (SiCN).

20. The semiconductor package of claim 18, wherein the second dielectric layer comprises at least one of prepreg, an Ajinomoto build-up film (ABF), and an epoxy molding compound (EMC).

\* \* \* \* \*